United States Patent
Yoon

(10) Patent No.: US 7,478,252 B2
(45) Date of Patent: Jan. 13, 2009

(54) POWER OFF CONTROLLERS AND MEMORY STORAGE APPARATUS INCLUDING A POWER-POLLING TIME CONTROL CIRCUIT

(75) Inventor: Jeong-Hyon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 483 days.

(21) Appl. No.: 11/237,809

(22) Filed: Sep. 28, 2005

(65) Prior Publication Data

US 2006/0136758 A1 Jun. 22, 2006

(30) Foreign Application Priority Data

Dec. 16, 2004 (KR) .................. 10-2004-0107146

(51) Int. Cl.
*G06F 1/00* (2006.01)
*G06F 12/00* (2006.01)
*G06F 11/00* (2006.01)

(52) U.S. Cl. .................. 713/300; 711/152; 714/22
(58) Field of Classification Search .................. 713/300
See application file for complete search history.

(56) References Cited

U.S. PATENT DOCUMENTS

| | | | | |
|---|---|---|---|---|
| 3,624,617 A | * | 11/1971 | Putterman et al. | 711/152 |
| 4,096,560 A | * | 6/1978 | Footh | 714/22 |
| 4,109,161 A | * | 8/1978 | Iijima | 307/87 |
| 4,234,920 A | * | 11/1980 | Van Ness et al. | 714/22 |
| 5,047,987 A | * | 9/1991 | Kosuge | 365/228 |
| 5,349,669 A | * | 9/1994 | Arai et al. | 365/228 |
| 5,473,496 A | * | 12/1995 | Rouy | 361/18 |

FOREIGN PATENT DOCUMENTS

| | | | |
|---|---|---|---|
| JP | 2004030662 A | * | 1/2004 |
| KR | 10-1997-008312 | | 11/1998 |
| KR | 10-1999-0014598 | | 11/1999 |
| KR | 10-2001-0048194 | | 5/2002 |
| KR | 10-2001-0057036 | | 3/2003 |

* cited by examiner

*Primary Examiner*—Suresh K Suryawanshi
(74) *Attorney, Agent, or Firm*—Myers Bigel Sibley & Sajovec, P.A.

(57) ABSTRACT

Memory storage apparatus include a non-volatile memory for storing data and a power management unit configured to sense a level of an external power supply and to predict a loss of the external power supply. A power-polling time control circuit is configured to control a time when a voltage level sourced from the external power supply is reduced below a predetermined level after loss of the external power supply. A control logic controls read and/or write operations of the non-volatile memory responsive to a prediction of loss of the external power supply from the power management unit.

20 Claims, 18 Drawing Sheets

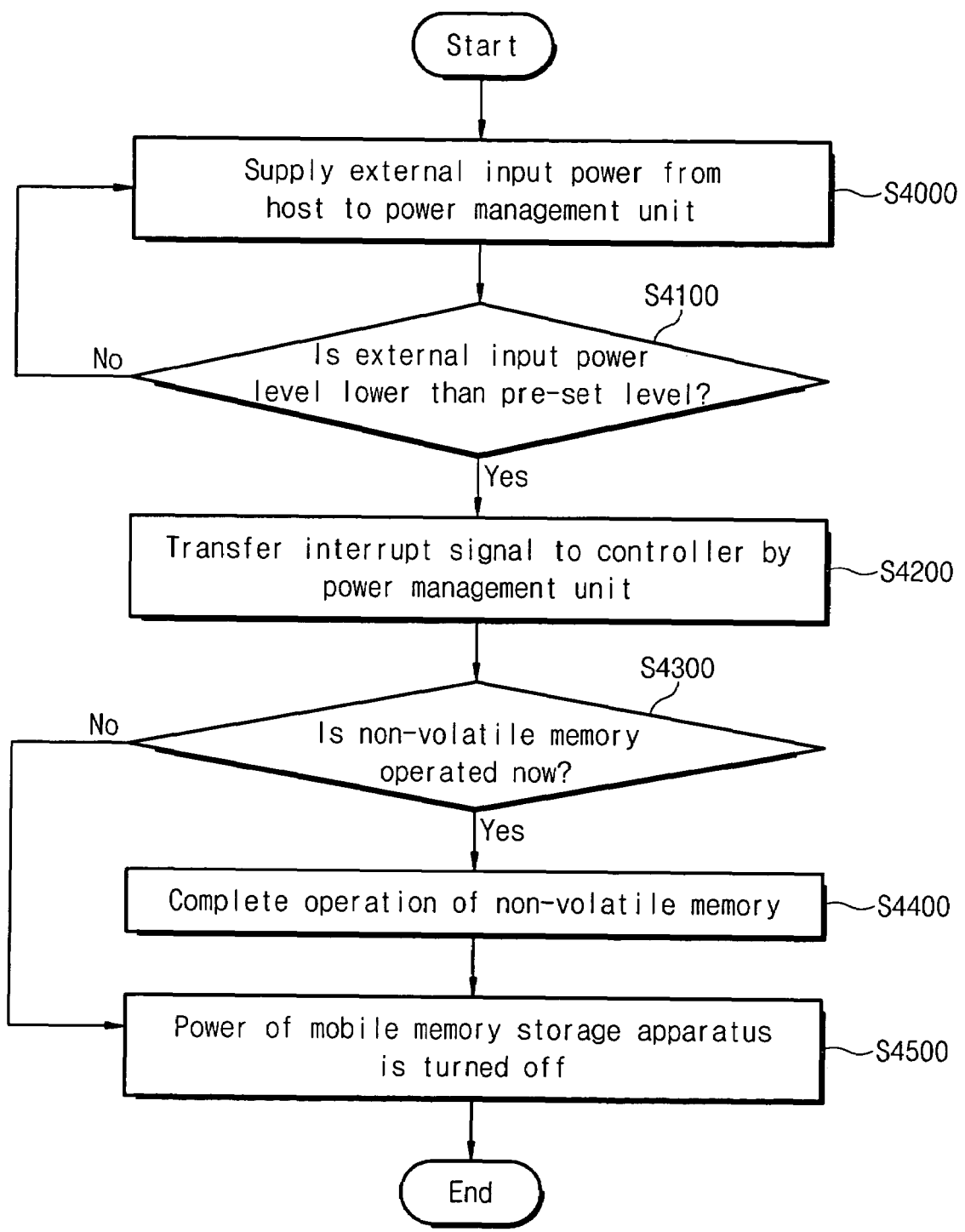

| Pin No | Name | Color | Description |
|--------|------|-------|-------------|
| 1 | VBUS | Red | Bus power |
| 2 | D- | White | Minus data |
| 3 | D+ | Green | Plus data |
| 4 | GND | Black | Ground |

POWER OFF CONTROLLERS AND MEMORY STORAGE APPARATUS INCLUDING A POWER-POLLING TIME CONTROL CIRCUIT

CROSS-REFERENCE TO RELATED APPLICATIONS

This application is related to and claims priority from Korean Patent Application No. 2004-107146, filed on Dec. 16, 2004, the contents of which are hereby incorporated herein by reference in their entirety.

FIELD OF THE INVENTION

This invention generally relates to a memory storage apparatus and, more particularly memory storage apparatus having power off control.

BACKGROUND OF THE INVENTION

Owing to the rapid development of information technology (IT) for harmonizing computers, communications, and broadcasting, advanced electrical information equipment is being continuously introduced. These digital technology developments have allowed users to enjoy various benefits. Recently, once such digital technology development is the introduction of various portable storage apparatus capable of storing multi-media data that may be used by the public with the digital technology development. Such devices have been used in applications such as digital camcoders, digital cameras, MP3 players, digital audio tape recorders, cellular phones, and PDAs. In order to store data, they typically employ memory devices or micro hard disks. Types of mobile memory cards include multi-media cards, secure-digital cards, compact flash cards, universal serial bus (USB) flash disks, and memory sticks. These devices may be simple, sturdy and removable. The memory cards are increasingly useful in our information oriented society because they may store information in a small size device, maintain information even if their power supply is turned off, and may store a large amount of information.

The development of memory cards generally is based in the advent of personal computer (PC) cards. PC cards have been used in handheld devices, such as notebooks, as early as the late 1980's and typically were compliant with memory extension standards and the size of a conventional credit card. A series of industry "PC Card Standards" are defined by standards originally developed by the Japan Electronic Industry Development Association (JEIDA), which are now being promulgated by the Personal Computer Memory Card International Association (PCMCIA), Sunnyvale, Calif., U.S.A. A series of industry "PC Card Standards" was further internationally standardized by JEIDA and PCMCIA in 1995.

Historically, as digital cameras have been introduced recently, most of the cameras typically store data in a built-in memory, however, some such cameras use a PC card as a storage media. With the current trend toward miniaturization of handheld devices since about 1990, the PC card's size has become relatively large for some applications. As such, a need developed for a smaller, lighter memory card. One such memory card, a "Compact Flash" was developed by Sandisk Corporation. This compact flash product generally is compatible with the PC card interface. PC cards generally can be mounted in a slot by an adaptor. In addition, other memories may use a PC card adaptor, but there may be differences in use as the adaptor for the compact flash may be used as only a simple connector without a logical data conversion.

With the advent of the compact flash, many other companies entered the memory card market and additional micro memory cards have become introduced. For example, Toshiba introduced smart media (at that time (about 1995), referred to as a "SSFDC (Solid State Floppy Disk Card)). Sony introduced the memory stick in about 1997 and MMC (Multi-Media Card) products were announced by companies including Hitachi and San Media. Another example is the "SD memory Card" introduced by companies including Matsushita, Toshiba, and Sandisk about 1998. In about 1999, "Secure MMC" and "Magic Gate Memory," which are subject to copyright protection, were announced by Hitachi and Sanyo, and Sony, respectively.

All mobile memory storage apparatus of above-mentioned generally require a power source for operation. The power may be supplied within a product by a power supply source. However, the power is generally supplied from a host connected to the memory storage apparatus. If the power is supplied from the host, the memory storage apparatus may be configured to address various potential problems. For example, the memory storage apparatus may suddenly be controlled from the host, or the power from the host may be cut off suddenly. In order to address such events, most current memory storage apparatus, as shown in FIG. 1, typically have a power-off recovery algorithm 50 that may be executed and/or stored in a controller 30.

A mobile memory storage apparatus 20 as illustrated in FIG. 1 includes a non-volatile memory 40 and the controller 30. The non-volatile memory 40 is a space for storing data, and the controller 30 controls read and write operations of the non-volatile memory 40. The power-off recovery algorithm 50 may be configured to respond to a sudden cut off of an external power supply to the apparatus 20. Even if power is abnormally cut off in the memory storage apparatus 20, the power-off recovery algorithm 50 may be operated so as to reduce the risk of or even prevent defects caused to data stored in the non-volatile memory 40 during power off.

The power-off recovery algorithm 50 may be performed repeatedly while the mobile memory storage apparatus 20 is in operation. As a result, the performance of the apparatus 20 may be degraded by diversion of resources from its memory storage operations. A firmware code that may be provided in a memory of the controller 30 or otherwise may also become more complex by adding additional software code for the power-off recovery algorithm 50. Moreover, due to an additional storage space for the power-off recovery algorithm 50, the amount of available storage capacity required in the controller 30 may be increased.

SUMMARY OF THE INVENTION

Embodiments of the present invention provide memory storage apparatus. The memory storage apparatus include a non-volatile memory for storing data and a power management unit configured to sense a level of an external power supply and to predict a loss of the external power supply. A power-polling time control circuit is configured to control a time when a voltage level sourced from the external power supply is reduced below a predetermined level after loss of the external power supply. A control logic controls read and/or write operations of the non-volatile memory responsive to a prediction of loss of the external power supply from the power management unit.

In other embodiments, the power management unit outputs an interrupt signal to the control logic when the sensed level of the external power supply is less than a reference voltage level. The reference voltage level may be less than a normal level of the external power supply and greater than a minimum voltage level at which the non-volatile memory is operated. The control logic may output a control signal responsive to receiving the interrupt signal to control a read and/or write operation of the non-volatile memory.

In further embodiments of the present invention, the power-polling time control circuit maintains the voltage level sourced from the external power supply above the predetermined level and the voltage level controlled by the power-polling time control circuit is provided to the non-volatile memory during a time while a current read and/or write operation of the non-volatile memory are completed when a loss of the external power supply is predicted. A level of the voltage level controlled by the power-polling time control circuit and provided to the non-volatile memory may range within an operation voltage range of the non-volatile memory during a time while a current read and/or write operation of the non-volatile memory is completed when a loss of the external power failure is predicted.

In other embodiments, when the interrupt signal is generated, after the non-volatile memory enters into a read and/or write operation mode, the control logic completes a current read and/or write operation of the non-volatile memory. When the interrupt signal is generated, the control logic may not input an initial operation command to the non-volatile memory.

In yet further embodiments, the power management unit and the power-polling time control circuit are a single chip integrated circuit device. The power management unit, the power-polling time control circuit, and the control logic may be a single chip integrated circuit device. The power management unit, the power-polling time control circuit, the control logic, and the non-volatile memory may be a single chip integrated circuit device.

In other embodiments, a restoration algorithm is not included in the memory storage apparatus. A power input to the power management unit, the power-polling time control circuit, the control logic, and the non-volatile memory may be supplied from an external apparatus coupled to the memory storage apparatus. The apparatus may further include a regulator coupled to the external power supply and a power input to the control logic and the non-volatile memory may be an output voltage generated by the regulator from the external power supply based on an input to the regulator comprising the voltage level sourced from the external power supply and controlled by the power-polling time control circuit. The power input to the non-volatile memory from the external power supply may pass through at least two regulators. The memory storage apparatus may be a multi-media card, a SD card (Secure Digital Card), a CF card (Compact Flash Card), a USB (Universal Serial Bus) flash disk and/or a memory stick.

In yet other embodiments, power off controllers for a memory storage apparatus include a power management unit configured to sense a level of an input from an external power supply and generate a power loss prediction signal responsive to the sensed level, the input being provided as a power source to a memory of the memory storage apparatus. A power-polling time control circuit is configured to control a rate at which the level of the input decreases after loss of the external power supply. A control logic controls a read and/or a write operation of the memory. The control logic is configured to control a current read and/or write operation of the memory responsive to the power loss prediction signal to allow completion of the current read and/or write operation before the level of the input decreases below a minimum level associated with operation of the memory. In further embodiments, memory storage apparatus are provided including such power off controllers and further including the memory.

In yet other embodiments, methods for controlling operation of a memory storage apparatus after loss of an external power supply of the apparatus are provided. The methods include detecting a level of an input of the memory storage apparatus configured to couple to the external power supply. A power loss prediction signal is generated when the detected level falls below a predetermined level, the predetermined level being less than a normal level of the external power supply and greater than a minimum voltage level at which the memory storage apparatus is operated. A rate of decrease of a level of a power input to a non-volatile memory of the memory storage apparatus generated from external power supply is controlled after a loss of the external power supply. A current read and/or write operation of the non-volatile memory is controlled responsive to the power loss prediction signal so that the current read and/or write operation will not cause a data error in the non-volatile memory due to loss of the external power supply.

In further embodiments memory storage apparatus include a non-volatile memory for storing data; a power management unit for sensing a power level of an external supply power to previously predict an power-off; a power-polling time control circuit for controlling a time when the external supply power is reduced; and a control logic for controlling read and write operations of the non-volatile memory device in response to a result for predicting the power-off of the power management unit.

BRIEF DESCRIPTION OF THE DRAWINGS

FIG. 3 is a flowchart illustrating operations of the mobile memory storage apparatus of FIG. 2 if an external supply power is turned off according to some embodiments of the present invention.

DETAILED DESCRIPTION OF THE INVENTION

Figure 1:
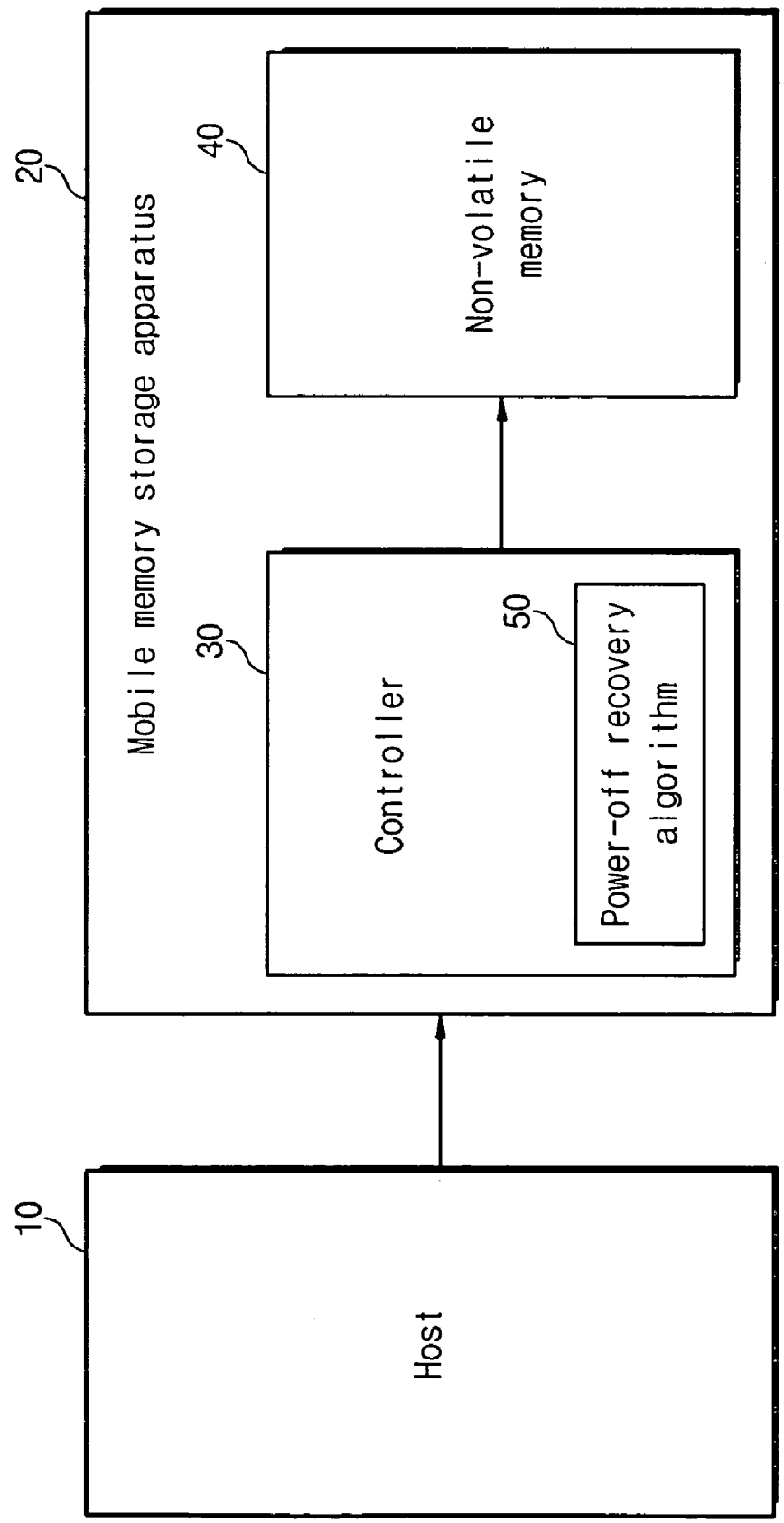
FIG. 1 is a block diagram illustrating a conventional mobile memory storage apparatus.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
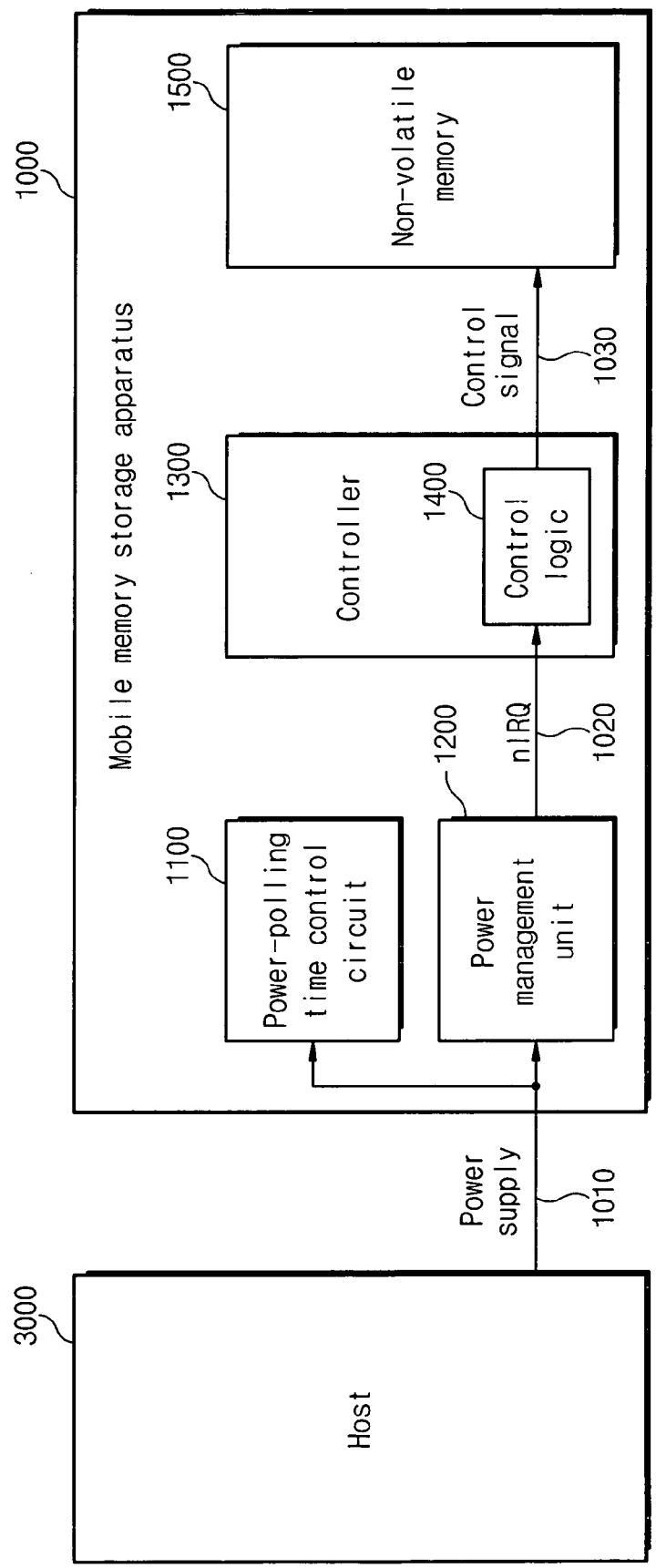
FIG. 2 is a block diagram illustrating a mobile memory storage apparatus according to some embodiments of the present invention.

The present invention will be described more fully hereinafter with reference to the accompanying drawings in which exemplary embodiments of the invention are shown. FIG. 2 is a block diagram illustrating a mobile memory storage apparatus 1000 according to some embodiments of the present invention. The illustrated mobile memory storage apparatus 1000 includes a power management unit 1200, a power-polling time control circuit 1100, and a controller 1300. The power management unit 1200 senses a level of a voltage input from an external source, via the power supply line 1010, to predict in advance an external power failure event. The power-polling time control circuit 1110 controls a time when the external supply power is reduced. The controller 1300 controls read and write operations of a non-volatile memory 1500 when a power-off sensing signal (nIRQ 1020) is input from the power management unit 1200. The power input to the power management unit 1200 may be maintained at a constant level when the host 3000 is not turned off. In contrast, if the power of the host 3000 is suddenly turned off, or the mobile memory storage apparatus 1000 is suddenly disconnected from the host 3000, the level of the power input to the management unit 1200 becomes low relatively as compared with a normal power supply. Thus, the power management unit 1200 senses that an input external power voltage level has dropped below a reference voltage, and then predicts an external power failure before the external power is completely turned off. If so, the power management unit 1200 outputs the interrupt signal nIRQ 1020. In order to predict the external power failure some time in advance of full loss of the external power source but not erroneously predict such an event, the reference voltage of the power management unit 1200 in some embodiments of the present invention is smaller than a voltage normally input from the external source and larger than a minimum voltage needed for operating the non-volatile memory 1500.

Similar to the power management unit 1200, the power-polling time control circuit 110 receives the power supply 1010 from the host 3000. The power-polling time control circuit 1100 primarily operates to extend a time when the external power is reduced so as to prevent a voltage from being immediately decreased when an external power source signal is reduced, such as when the external power source is turned off. Accordingly, the power-polling time control circuit 1100 may include a device, such as a capacitor, capable of accumulating charges. The power-polling time control circuit 1100 in some embodiments secures the maximum time from an input point of an initial operation command of the non-volatile memory 1500 in generating the interrupt signal nIRQ as an external power failure prediction signal to a completion point of an operation of the non-volatile memory 1500 (i.e, a time which may allow completion of an operation (read, write, etc.) that is in progress. Also, during the time for securing a voltage, a level of a voltage supplied to the non-volatile memory 1500 may be maintained at a level above a minimum voltage at which the non-volatile memory 1500 is operated. As the power-polling time control circuit 1100 may be operated as an operation power source of the non-volatile memory 1500, a voltage output by the power-polling time control circuit 1100 in some embodiments is used as an input voltage of the non-volatile memory 1500.

In a conventional memory apparatus, the controller 30 operates to control read and write operations of the non-volatile memory 40. The controller 1300 of some embodiments of the present invention, however, is used as such a controller as well as including a control logic 1400, which may be incorporated into an otherwise conventional controller 30. The control logic 1400 in some embodiments is configured to predict an external power failure responsive to a received interrupt signal nIRQ 1020 from the power management unit 1200. The control logic 1400 that receives the interrupt signal 1020 checks whether or not the non-volatile memory 1500 is being operated. If the non-volatile memory 1500 is performing read and/or write operations, the control logic 1400 controls operations so that the non-volatile memory 1500 does not receive further initial operation commands after completion of the underway operation of the non-volatile memory 1500. To the contrary, if the non-volatile memory 1500 is not performing an operation, the control logic 1400 may control operations to that the non-volatile memory 1500 does not receive any subsequent initial operation command.

The non-volatile memory 1500 of the illustrated embodiments receives a voltage via the power-polling time control circuit 1100 as an input voltage. According to a control signal 1030 from the control logic 1400 in the controller 1300, the non-volatile memory 1500 is controlled. For instance, if the external power failure is predicted during a write operation of the non-volatile memory 1500, the power management unit 1200 transfers the interrupt signal 1020 to the control logic 1400, and then the control logic 1400 transfers the control signal 1030 to the non-volatile memory 1500. In order to normally complete the underway write operation of the non-volatile memory 1500, the power-polling time control circuit 1100 supplies the required power. As such, even if an external power source is lost during the write operation of the non-volatile memory 1500, data stored in the non-volatile memory 1500 may be maintained without error.

Operations of the mobile memory storage apparatus 1000 during an external power failure will now be more fully described for some embodiments of the present invention with reference to the flowchart illustration of FIG. 3. As shown in FIG. 3, an external power is supplied from a host 3000 to the power management unit 1200 of the mobile memory storage apparatus (block S4000). To predict whether or not an external power is still being supplied, the power management unit 1200 detects whether the input external power voltage level becomes lower than a reference level (block S4100). If the external power voltage is lower than the reference level, the power management unit 1200 responds to the prediction of the external power failure and an interrupt signal is generated and provided to the control logic 1400 in the controller 1300 (block S4200). The control logic 1400 in the controller 1300 determines whether the non-volatile memory 1500 is being operated (block S4300). If the non-volatile memory 1500 is being operated (accessed) (block S4300), the control logic 1400 completes the present operation of the non-volatile memory 1500 (block S4400). After the above-mentioned processes, the power of the mobile memory storage apparatus 1000 is turned off (block S4500).

Figure 4A:
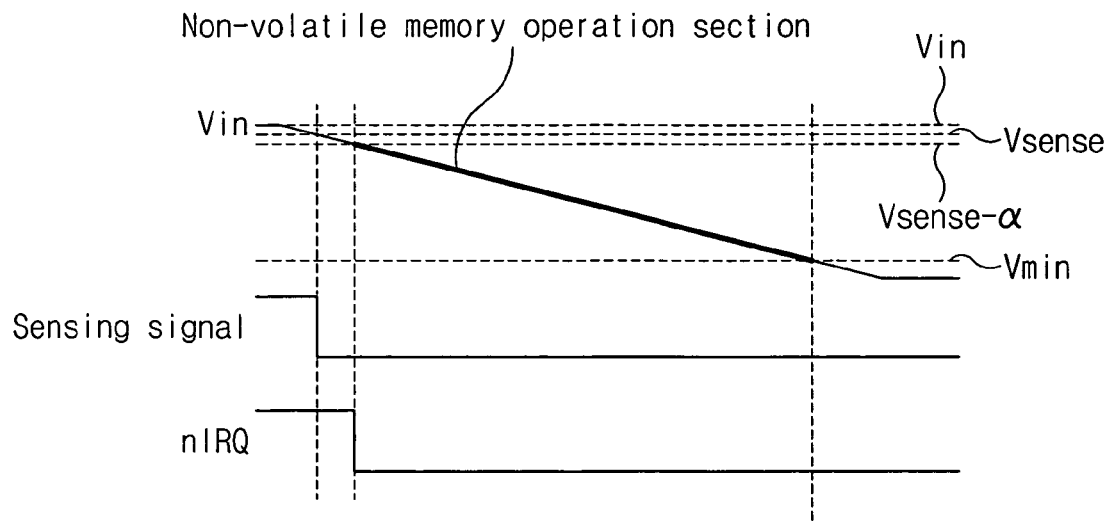
FIG. 4A is a timing diagram illustrating a variation of a signal of the mobile memory apparatus with a variation of the external supply power.

Some embodiments of the present invention will now be further described with reference to the signal graphs of FIGS. 4A-4C. An input voltage signal Vin of FIG. 4A represents a voltage input from the exterior of the mobile memory storage apparatus 1000 and shows that an external input voltage is reduced slowly. In a case where the power of the host 3000 is suddenly turned off, or the mobile memory storage apparatus is disconnected from the host 3000, an external input voltage applied to the mobile memory storage apparatus 1000 may drop more suddenly. However, based on operations of the power-polling time control circuit 1100, as shown in FIG. 4A, even when the source drops suddenly, the slope of the detected input voltage Vin of FIG. 4A may decline gradually. The power-polling time control circuit 1100 may use a device, such as a capacitor, capable of accumulating charges so that it can control that the input voltage Vin to slowly decline, for example, with a regular slope. This slope may be controlled according to a capacitance used in the power-polling time control circuit 1100. The input voltage signal Vin is supplied an input voltage of the non-volatile memory 1500. In this case, the voltage level of the input voltage signal Vin to the non-volatile memory 1500 is slowly dropped using the power-polling time control circuit 1100.

The signal Vsense represents a signal sensed by the power management unit 1200 in the mobile memory storage apparatus 1000 of FIG. 2. If a voltage input from exterior to the power management unit 1200 is lower than a reference voltage Vsense for predicting the cut-off of an external input voltage, the level of the Sensing signal (middle curve of FIG. 4A) is activated, for example, transitions from a logic high to a logic low level.

The power management unit 1200 predicts the cut-off of an external voltage by the Sensing signal Vsense and then transfers the interrupt signal nIRQ 1020 to the control logic 1400 in the controller 1300. In other words, after the Sensing signal is transitioned from a high level to a low level, the interrupt signal nIRQ 1020 is varied from a high level to a low level. Due to a time difference between the Sensing signal and the interrupt signal nIRQ, a voltage level difference of a limited degree (to Vsense-α) may have occurred in the input voltage Vin before nIRQ is transitioned. For the external input voltage Vin of FIG. 4A, the non-volatile memory 1500 is operable in a voltage level section between a voltage level (Vsense-α) at a point when the interrupt signal nIRQ is applied and the minimum operation voltage Vmin of the non-volatile memory 1500.

Figure 4B:
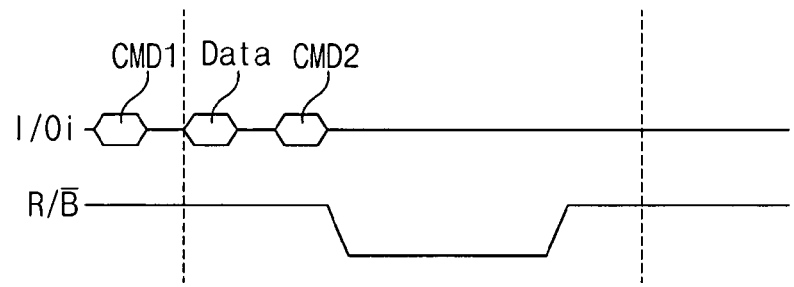
FIG. 4B is a timing diagram illustrating input and output signals of a non-volatile memory when an initial operation command of a non-volatile memory in the mobile memory storage apparatus is input before a signal for predicting an external power failure is applied.
Figure 4C:
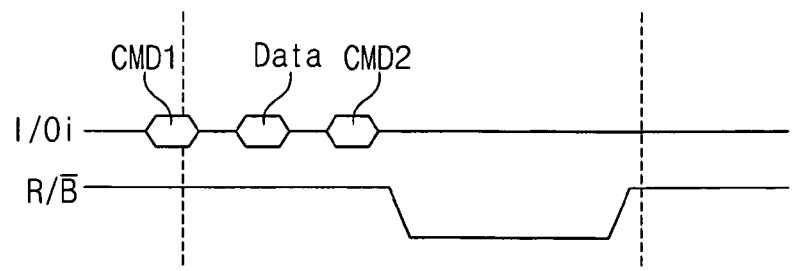
FIG. 4C is a timing diagram illustrating input and output signals of a non-volatile memory when an initial operation command of a non-volatile memory in the mobile memory storage apparatus is input at a point where a signal for predicting an external power failure is applied.

FIG. 4B is a timing diagram illustrating input and output signals of a non-volatile memory 1500 when an initial operation command of a non-volatile memory 1500 in the mobile memory storage apparatus 1000 is input before a signal for predicting an external power failure is applied. FIG. 4C is a timing diagram illustrating input and output signals of a non-volatile memory 1500 when an initial operation command of a non-volatile memory 1500 in the mobile memory storage apparatus 1000 is input at a point after a signal for predicting an external power failure is applied.

A signal I/Oi of FIG. 4B represents an input and output of an interface between the non-volatile memory 1500 and the controller 1300. R/B represents an operation state of the non-volatile memory 1500. The I/Oi transfers CMD1, DATA, and CMD2. The CMD1 is a command with respect to read and write operations of the non-volatile memory, the DATA transfers data that is be stored in the non-volatile memory 1500, and the CMD2 transfers a program command for performing the operation of the non-volatile memory. As shown in FIG. 4B, if the CMD1 being an initial command for read or write operation of the non-volatile memory 1500 is input before the interrupt signal nIRQ for predicting the cut-off of the external power is applied, the operation command transferred to the CMD1 may be completely performed within an operable voltage section in the non-volatile memory 1500. Moreover, any operation performance command is not input through input/output interfaces in the non-volatile memory 1500. Similarly, as shown in FIG. 4C, if the interrupt signal nIRQ for predicting the cut-off of the external power is applied while the CMD1 being the initial command for read and write operation of the non-volatile memory 1500 is input, the operation command transferred to the CMD1 is completely performed within an operable voltage section in the non-volatile memory 1500.

If the CMD1 being the initial command for read and write operation of the non-volatile memory 1500 is input after the interrupt signal nIRQ for predicting the cut-off of the external power is applied, however, the controller 1300 does not allow the operation of the non-volatile memory 1500.

Figure 5:
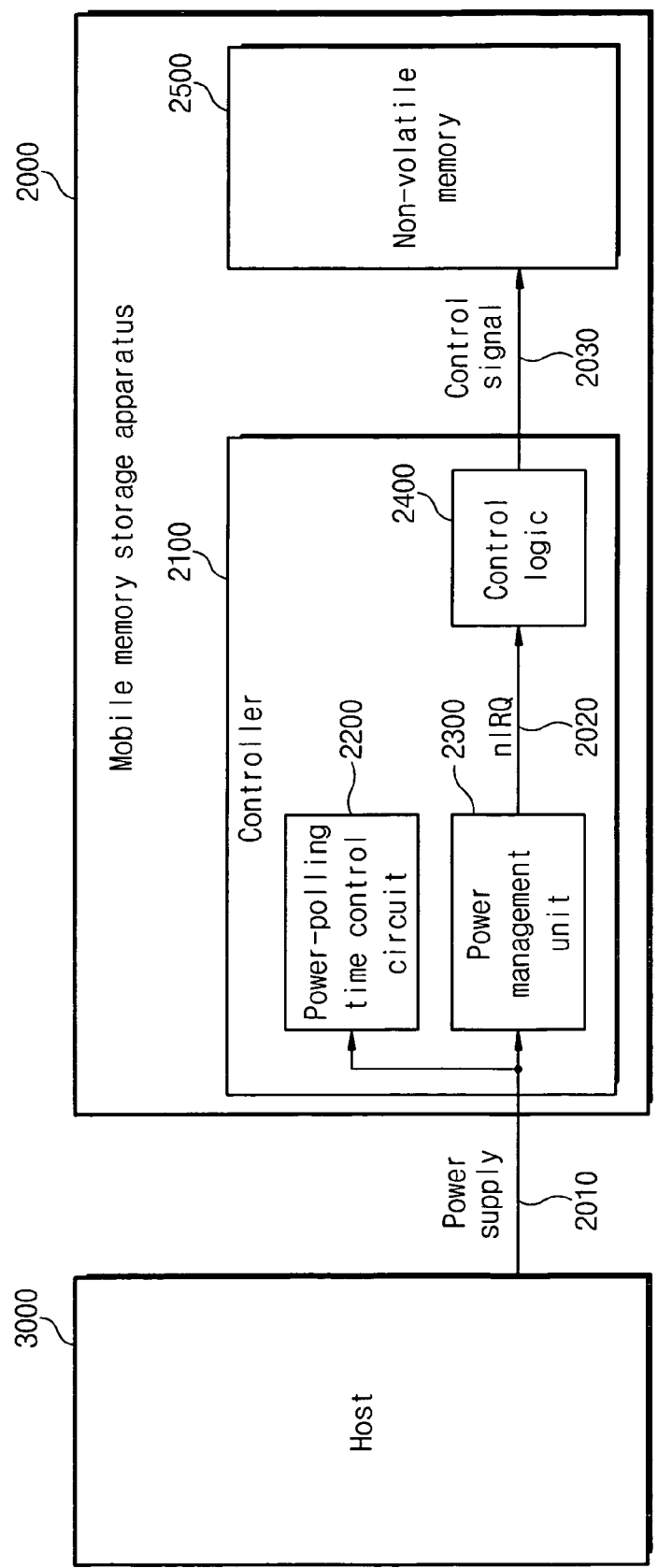
FIG. 5 is a block diagram illustrating a mobile memory storage apparatus according to other embodiments of the present invention.

FIG. 5 is schematic block diagram illustrating further embodiments of the present invention. The embodiments of FIG. 5 differ from those of FIG. 2 in that a power-polling time control circuit 2200 and a power management unit 2300 are located in the controller 2100. The operation principle of the mobile memory storage apparatus 2000 of FIG. 5 according to a variation of an external power supply is generally the same as that of the mobile memory storage apparatus of FIG. 2 and such common aspects need not be further described herein.

As previously mentioned, the present invention is applicable in various applications such as where the features of the mobile memory storage apparatus of FIGS. 2 and/or 5 may be incorporated, for example, in a single chip. For example, the power management unit 1200 and power-polling time control circuit 1100 of the mobile memory storage apparatus of FIG. 2 may be constituted as a single chip. The power management unit 1200, power-polling time control circuit 1100, and control logic 1400 may be applicable to a memory storage apparatus that is itself incorporated as a single chip. Also, the power management unit 1200, power-polling time control circuit 1100, the control logic 1400, and the non-volatile memory 1500 may all be part of a single chip.

Figure 6:
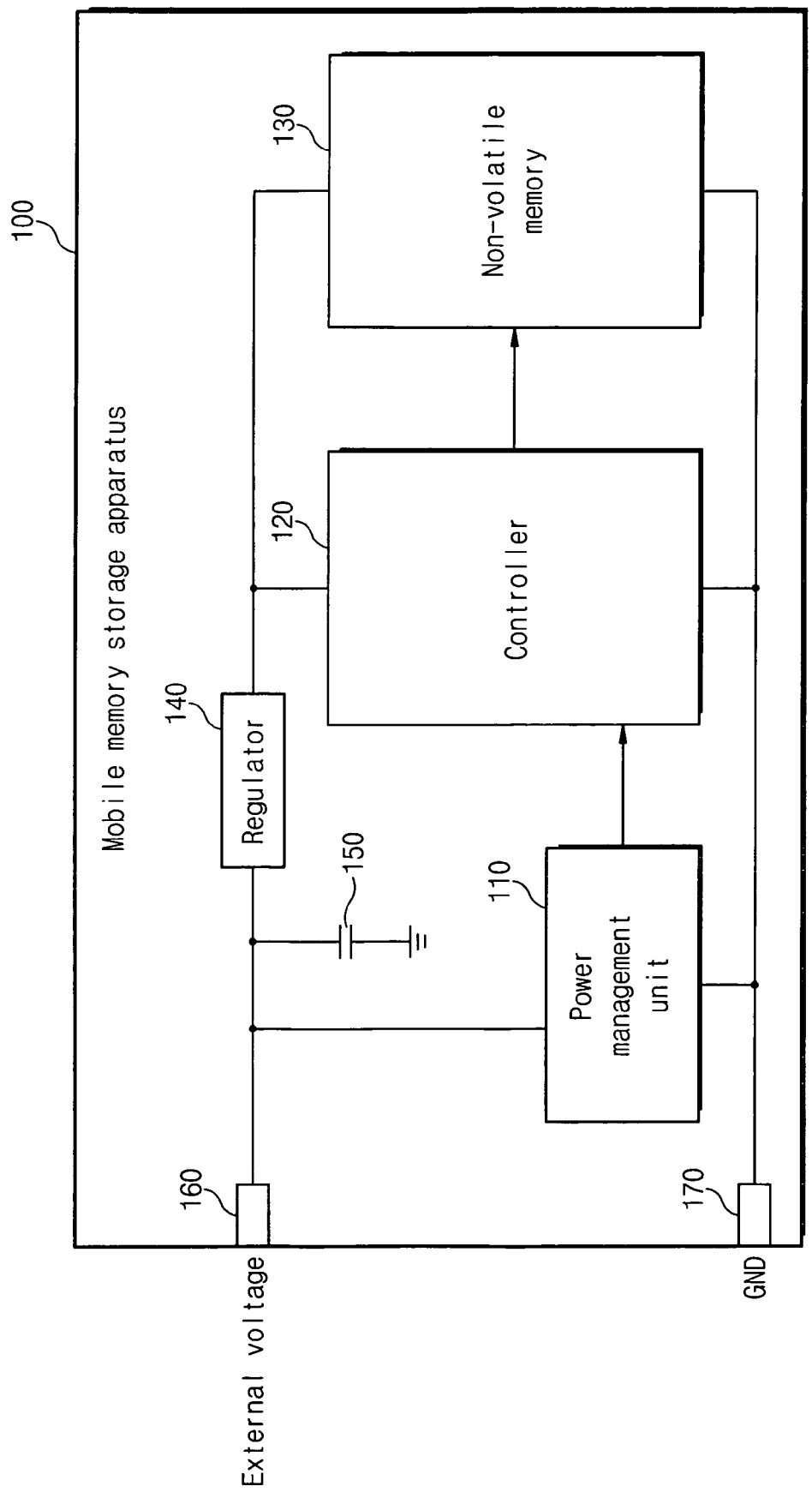
FIG. 6 is a block diagram illustrating a power system of the mobile memory storage apparatus according to some embodiments of the present invention.
Figure 7:
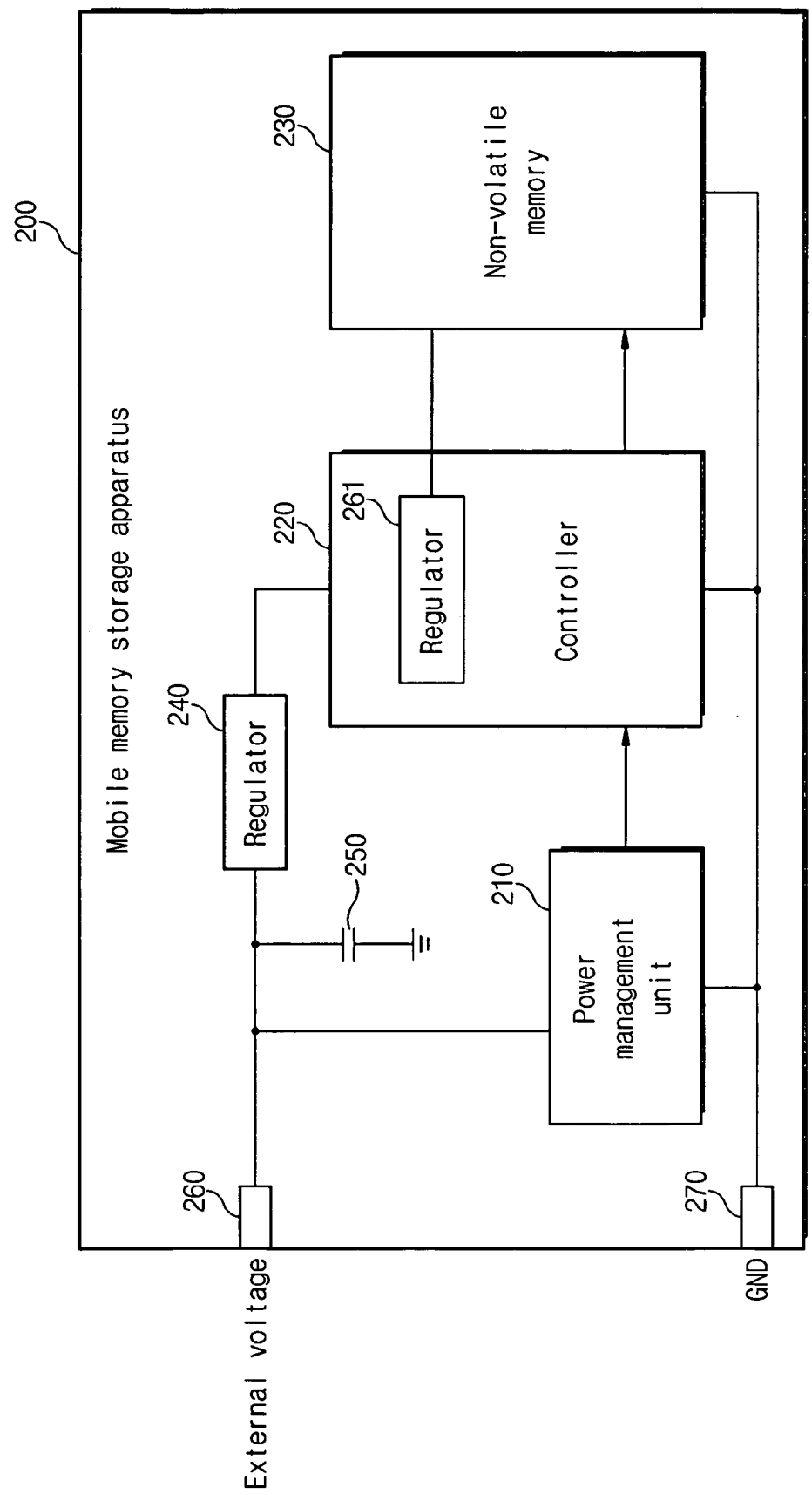
FIGS. 7-13 are block diagrams illustrating power systems for the mobile memory storage apparatus of FIG. 6 according to various embodiments of the present invention.
Figure 8:
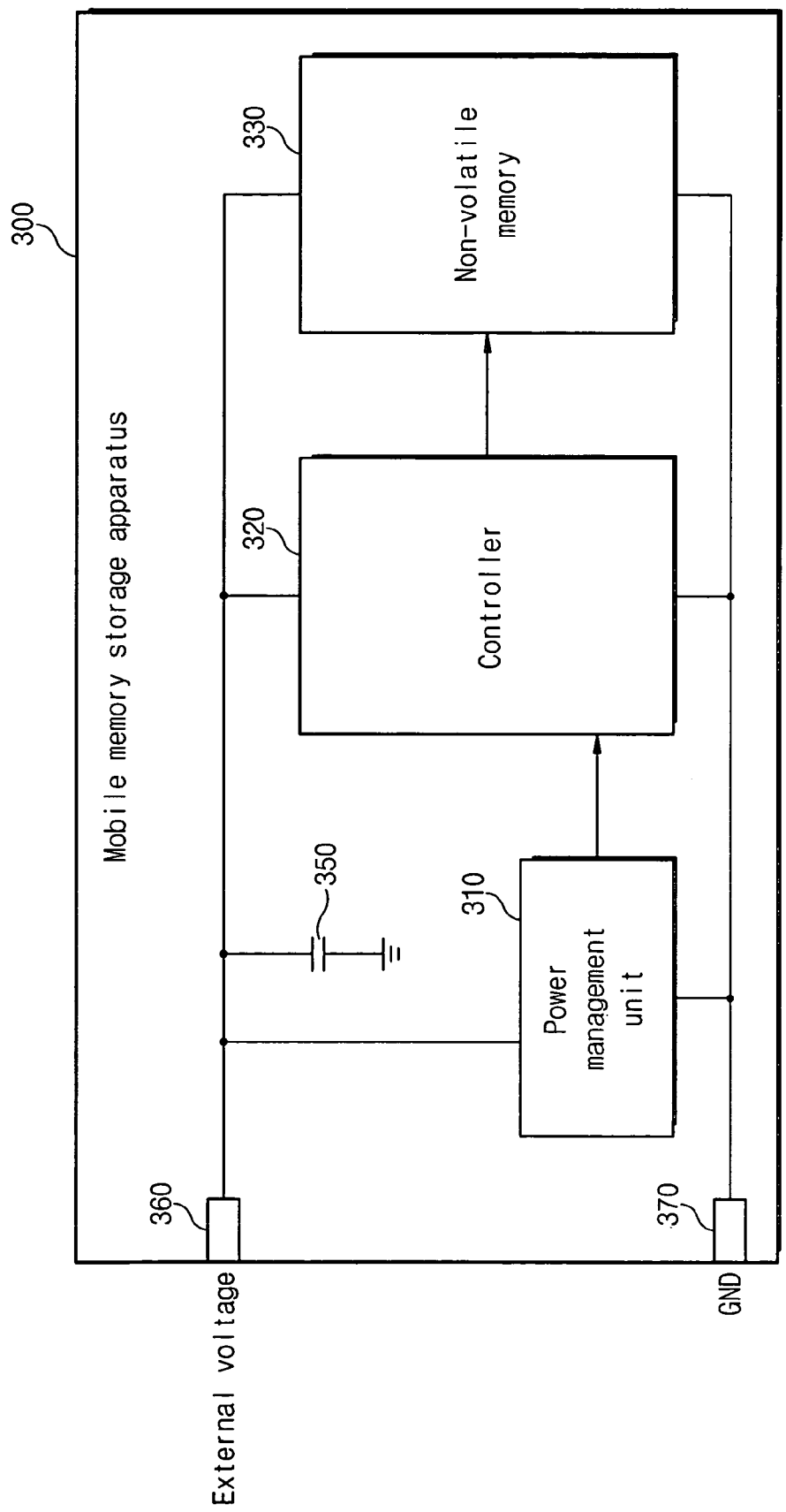
Figure 9:
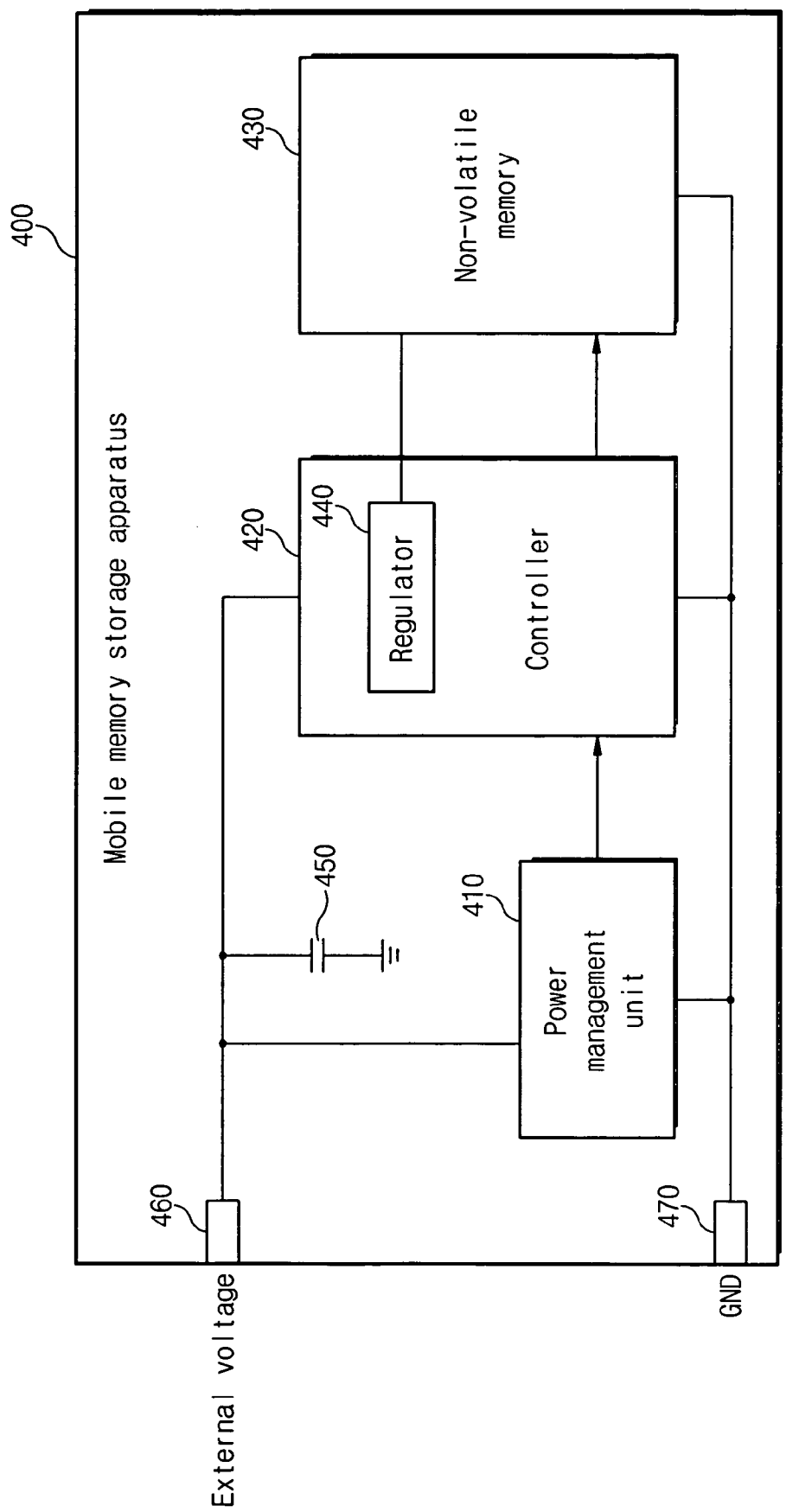
Figure 10:
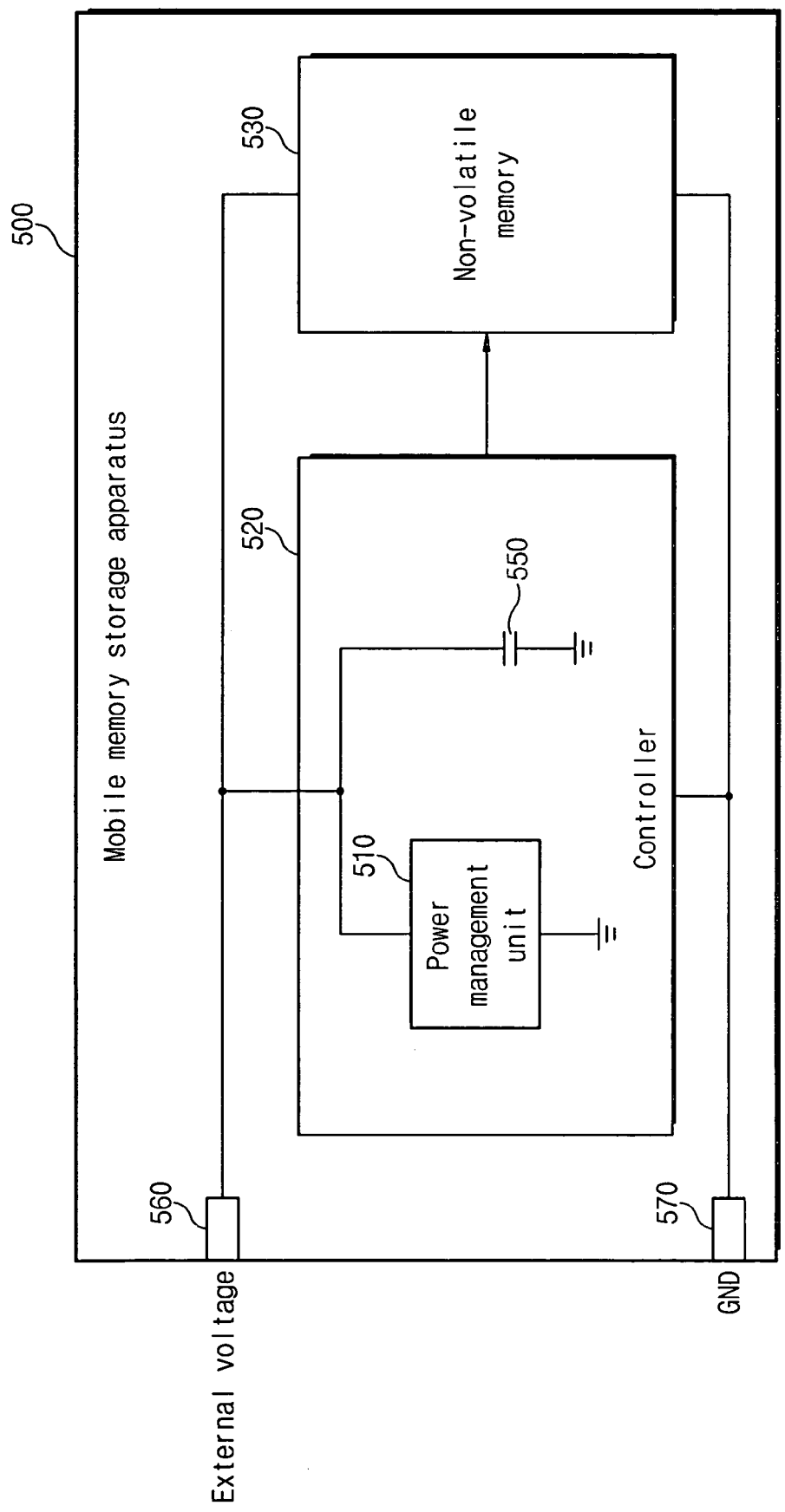
Figure 11:
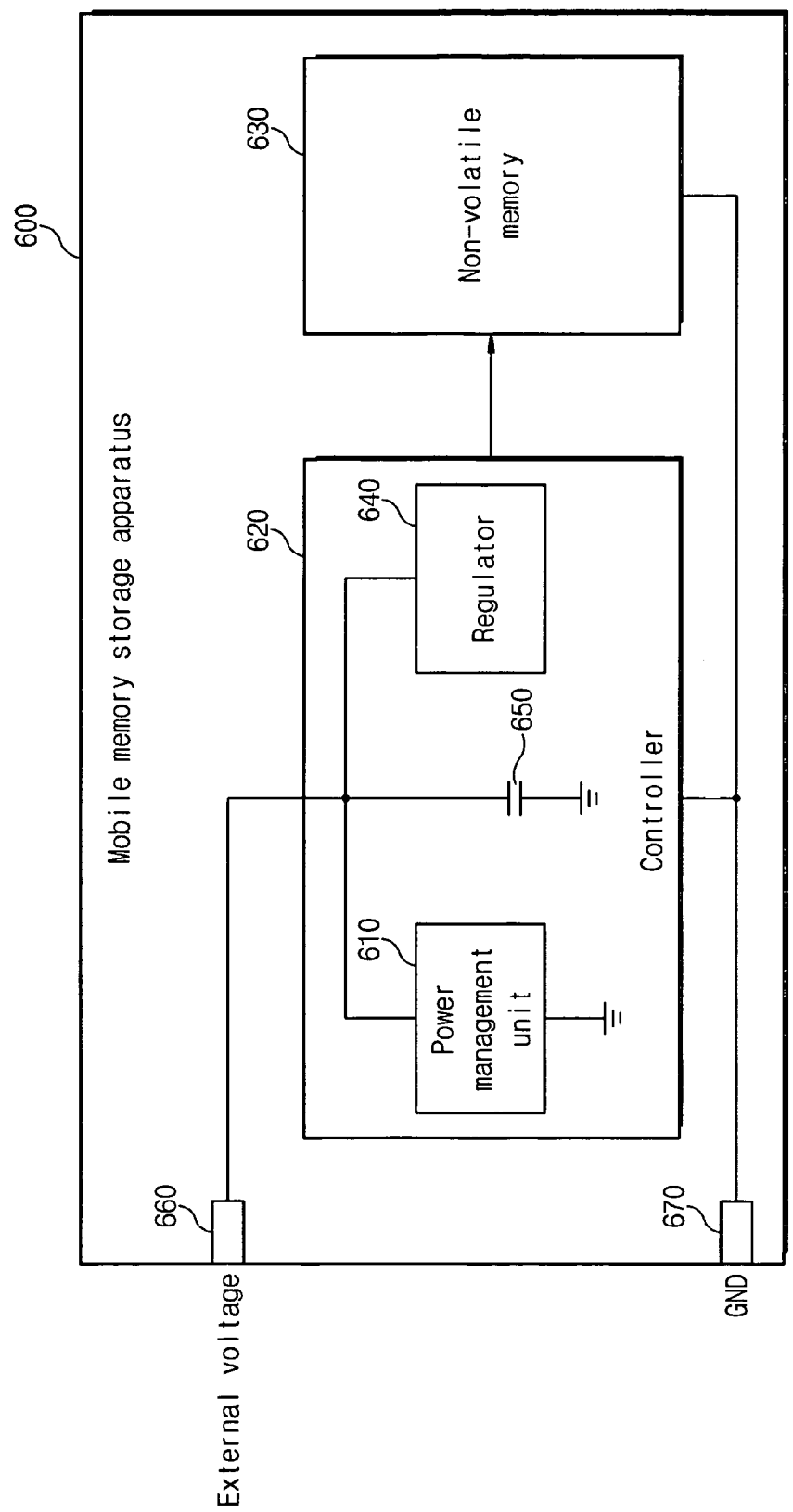
Figure 12:
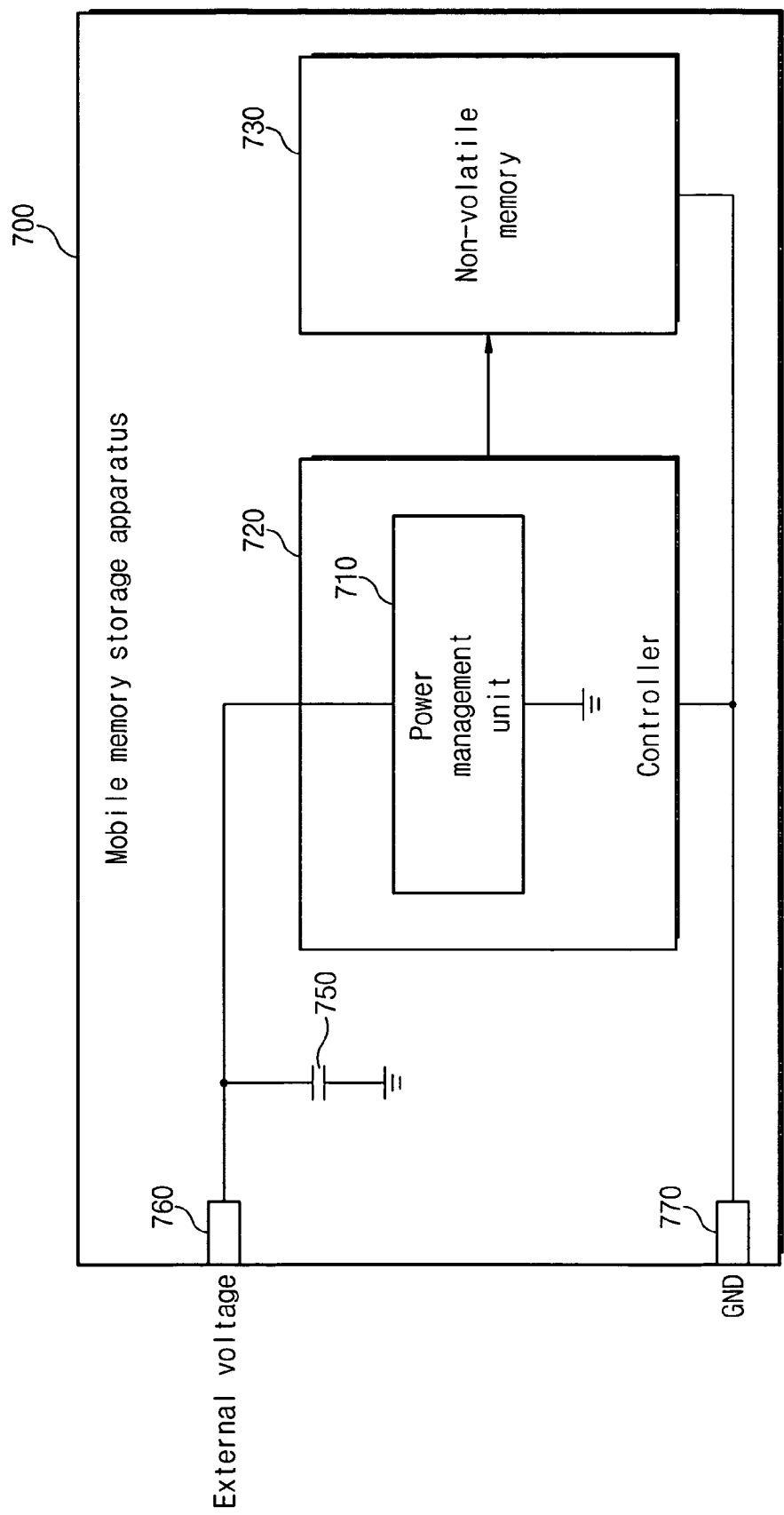
Figure 13:
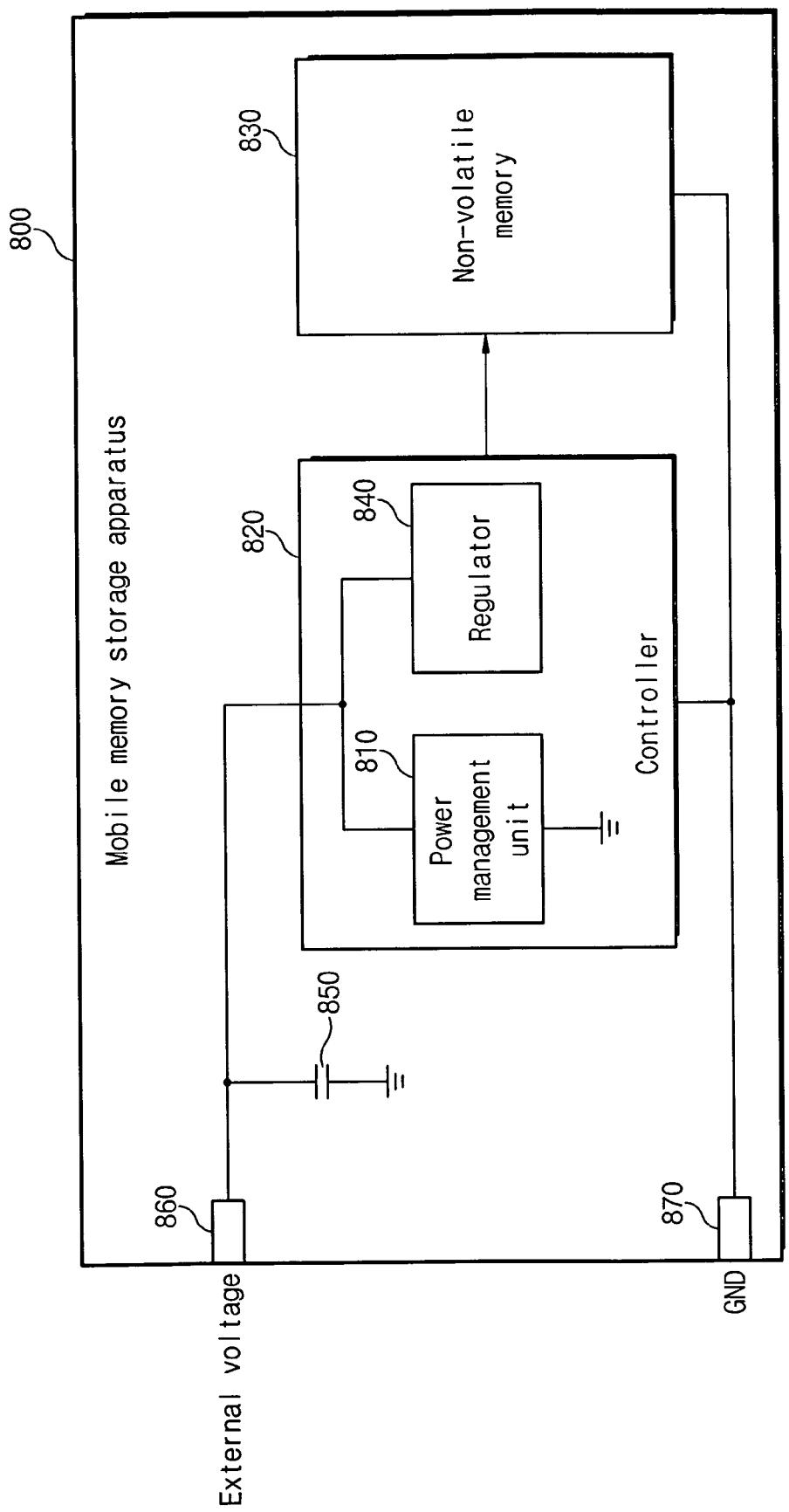

A power system applied to each of elements in the mobile memory storage apparatus according to some embodiments of the present invention will now be further described. FIG. 6 is a block diagram of a power system incorporated in a mobile memory storage apparatus 100 according to some embodiments of the present invention. In order to operate the mobile memory storage apparatus 100, there is an external voltage pin 160 for receiving power from the exterior and a ground pin (GND) 170. A voltage applied from the external voltage pin 160 is used as an input power source of a capacitor 150 (which provides a power polling time control circuit) and the power management unit 110. After the voltage by way of the power-polling time control circuit (the capacitor 150) passes by a regulator 140 that controls a voltage level so as to supply a desired voltage to the controller 120 and the non-volatile memory 130, it is supplied to the controller 120 and the non-volatile memory 130.

FIGS. 7 to 13 are modified block diagrams illustrating further embodiments including variations on those of FIG. 6, which show various power systems, which are input to elements in the mobile memory storage apparatus. Like numbered items (i.e., 120, 220, 320 etc.) correspond to those described above with reference to the embodiments of FIG. 6 and will not be further described herein. The respective embodiments of FIGS. 7-13 will now be briefly described with reference to some differences of these embodiments from the embodiments described with reference to FIG. 6. The embodiments of FIG. 7 differ in the inclusion of an additional regulator 261 in the controller 220 that provides a regulated voltage to the non-volatile memory 230. The embodiments of FIG. 8 differ in the omission of the regulator 140. The embodiments of FIG. 9 differ in the inclusion of the regulator 440 in the controller 420. The embodiments of FIG. 10 differ in the inclusion of the power management unit 510 and the capacitor 550 in the controller 520. The embodiments of FIG. 11 differ in the inclusion of the power management unit 610, capacitor 650 and regulator 640 in the controller 620. The embodiments of FIG. 12 differ in the inclusion of the power management unit 710 in the controller 720. The embodiments of FIG. 13 differ in the inclusion of the power management unit 810 and regulator 840 in the controller 820.

Figure 14:
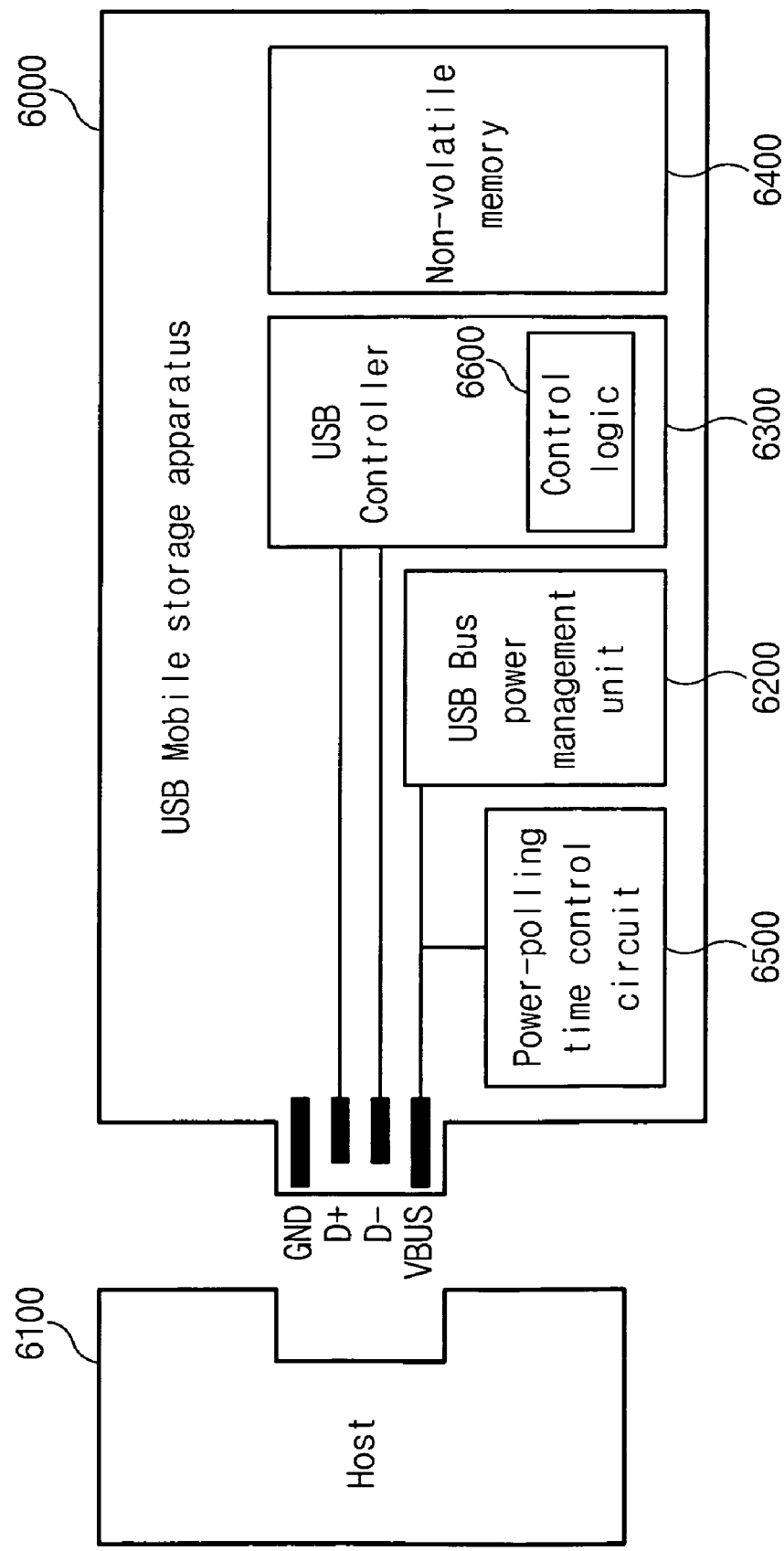
FIG. 14 is a schematic block diagram of a universal serial bus (USB) mobile storage apparatus according to some embodiments of the present invention.

FIGS. 14 to 18 are block diagrams illustrating examples of application of embodiments of the present invention to USB mobile storage apparatus, as an exemplary type among various mobile memory storage apparatus in which embodiments of the invention may be used. As seen in the embodiments of FIG. 14, a USB mobile storage apparatus 6000, coupled to a host 6100, includes a USB BUS power management unit 6200 that checks an external voltage input through pin VBUS to the USB mobile storage apparatus 6000 and predicts the cut-off of an external power supply. In this case, the external power inputted through VBUS of the USB mobile storage apparatus 6000 is also applied to a power-polling time control circuit 6500, so that a time when the power is reduced is controlled. If the USB bus power management unit 6200 predicts the cut-off of the external power supply, an interrupt signal is transferred to the control logic 6600 in the USB controller 6300. The control logic 6600 checks the operation state of the non-volatile memory 6400 to transfer a control signal.

Figure 15:
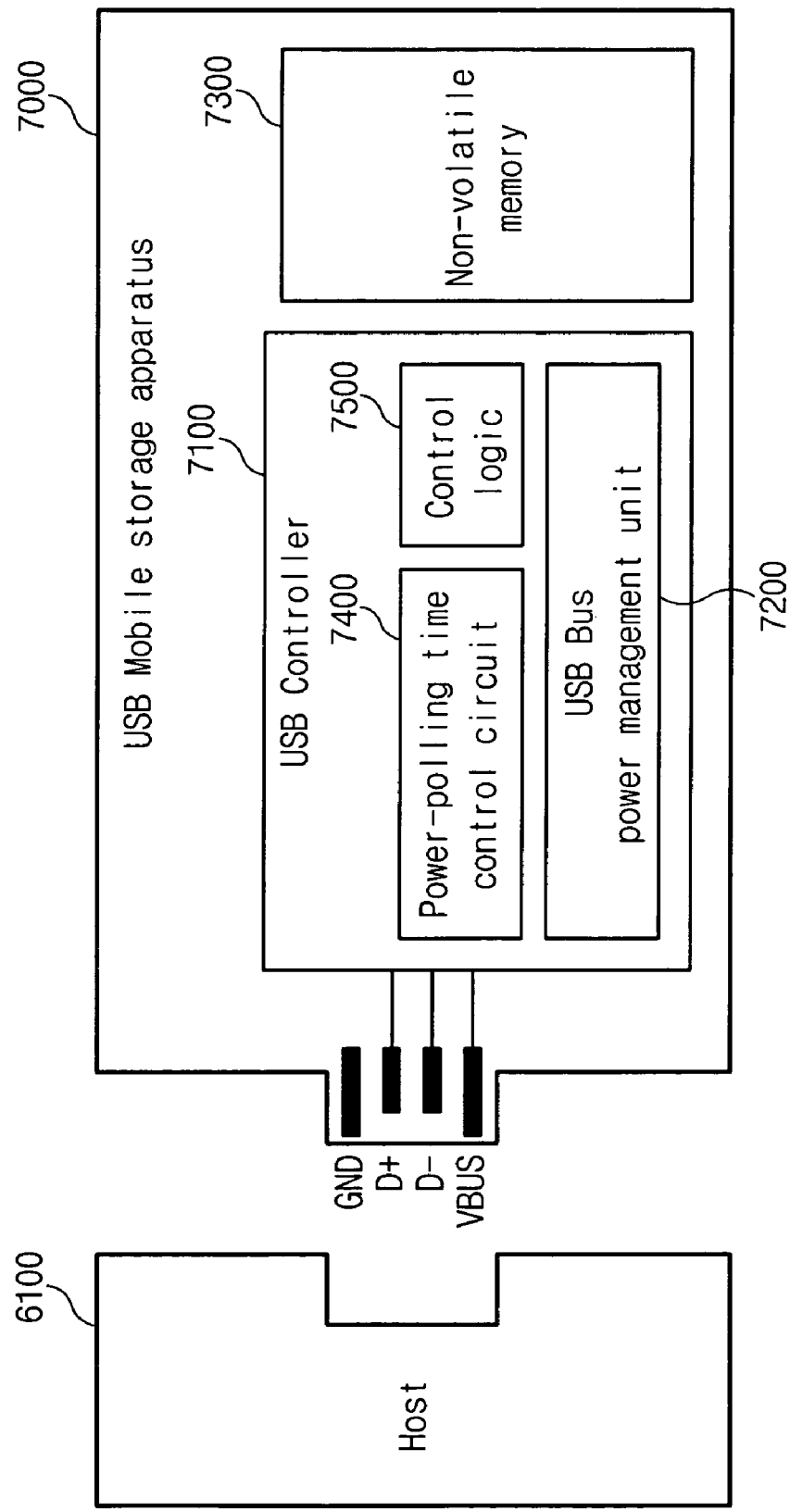
FIG. 15 is a schematic block diagram of a USB mobile storage apparatus according to further embodiments of the present invention.

FIG. 15 is a schematic block diagram of a USB mobile storage apparatus 7000 according to further embodiments of the present invention. In the embodiments of FIG. 15, a USB bus power management unit 7200 for predicting the cut-off of an external power supply and a power-polling time control circuit 7400 for controlling a time when an external voltage is reduced are located in an USB controller 7100.

Figure 16:
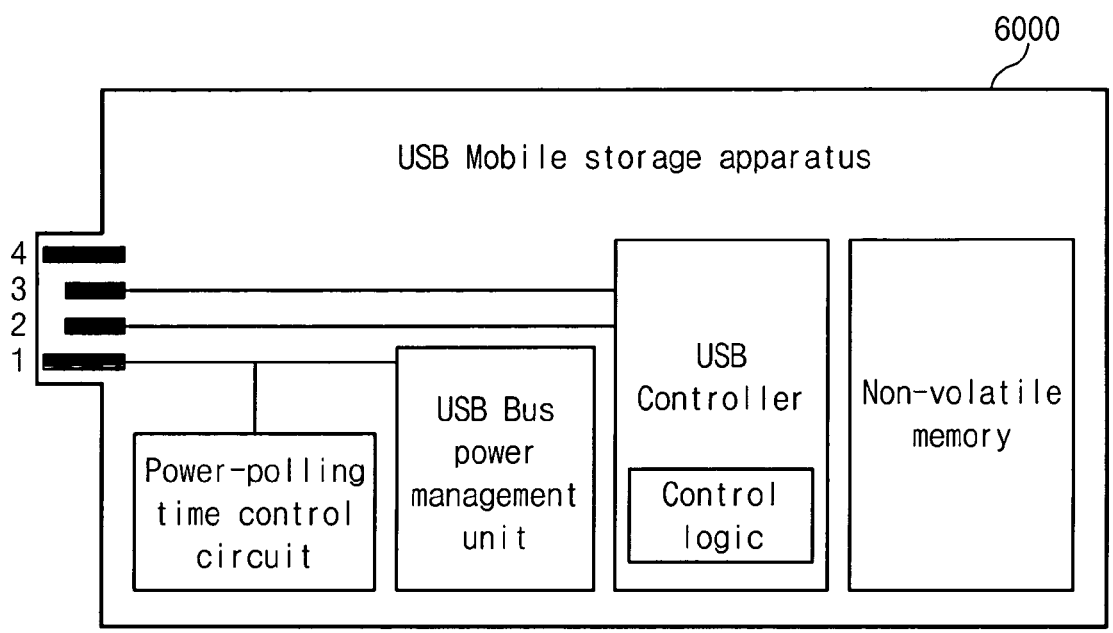
FIG. 16 is a schematic block diagram of a USB mobile storage including a table showing an assignment of pins of the USB mobile storage apparatus according to some embodiments of the present invention.

FIG. 16 shows a configuration of four external connection pins in the USB mobile storage apparatus 6000 according to some embodiments of the present invention. A conventional USB mobile storage apparatus has four connection pins. The conventional USB mobile storage apparatus input pins include a VBUS (1), a ground GND (4), a minus data D−(2), and a plus data D+(3). The VBUS (1) and ground GND (4) receive power from the exterior, and data is transferred from the exterior to the USB storage apparatus by the minus data D−(2), and plus data D+(3).

Figure 17:
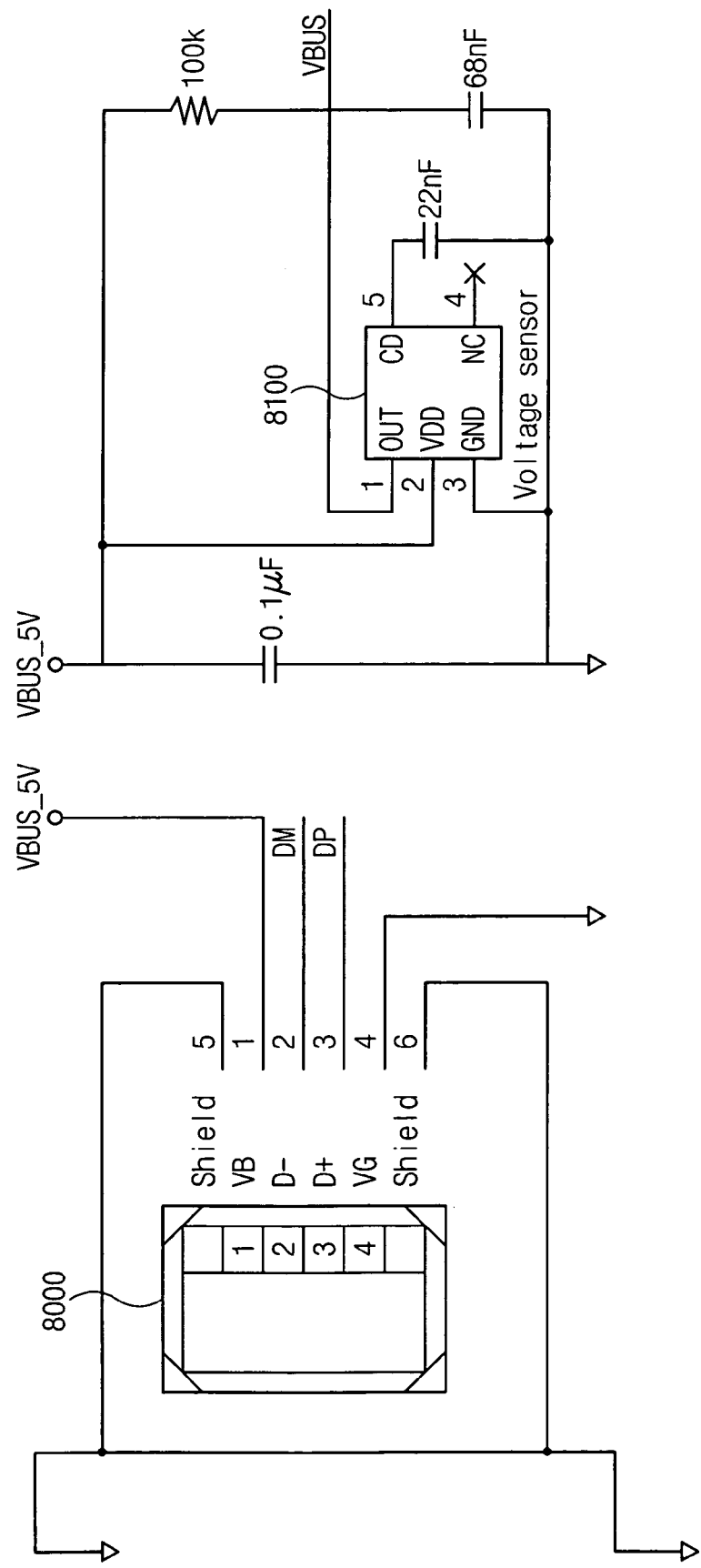
FIG. 17 is a circuit diagram illustrating a portion of a USB mobile storage apparatus according to some embodiments of the present invention.

FIG. 17 is a circuit diagram illustrating a portion of a USB mobile storage apparatus according to some embodiments of the present invention. A voltage sensor 8100 receives 5V along a VBUS line of the USB mobile storage apparatus. If input power becomes below a reference level, the voltage sensor 8100 outputs a signal for predicting the cut-off of an external power supply. A capacitor (22 nF) shown coupled to the voltage sensor 8100 in FIG. 17 serves as a different component than the capacitor described for the above-mentioned power-polling time control circuit and operates to assist in operations of the voltage sensor 8100.

Figure 18:
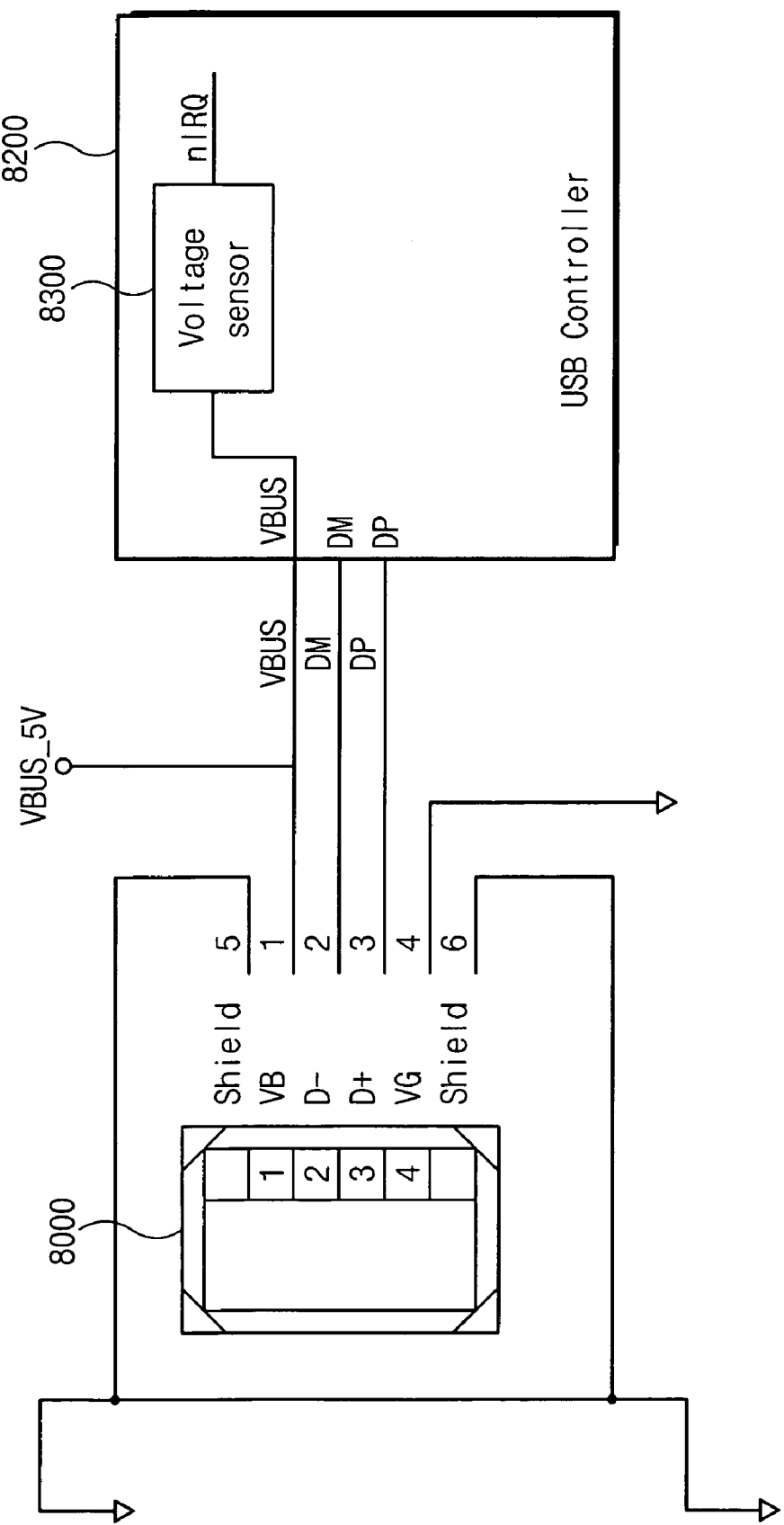
FIG. 18 is a circuit diagram illustrating a portion of a USB mobile storage apparatus according to further embodiments of the present invention.

FIG. 18 is a circuit diagram showing a portion of a USB mobile storage apparatus corresponding to the portion illustrated in FIG. 17 according to other embodiments of the present invention. In FIG. 18, a voltage sensor 8300 is located in the USB controller 8200. Similar to the voltage sensor 8100 of FIG. 17, the voltage sensor 8300 of FIG. 18 receives 5V along the VBUS line of the USB mobile storage apparatus. If input power becomes below a reference level, the voltage sensor 8300 outputs an interrupt signal for predicting the cut-off of the external power supply.

As previously mentioned, it is possible to predict in advance the cut-off of an external power supply through a voltage level sensing, which power supply is input from the exterior of the mobile memory storage apparatus. As a result, data stored in the memory storage apparatus can be maintained in integrity. By replacing and/or modifying a conventional power-off recovery algorithm, a firmware of the memory device may be simplified, a memory usage in connection with power recovery may be decreased, and an operation performance of the memory devices may be improved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A memory storage apparatus comprising:
   a non-volatile memory for storing data;
   a power management unit configured to sense a level of an external power supply and to predict a loss of the external power supply;
   a power-polling time control circuit configured to control a time when a voltage level sourced from the external power supply is reduced below a predetermined level after loss of the external power supply; and
   a control logic that controls read and/or write operations of the non-volatile memory responsive to a prediction of loss of the external power supply from the power management unit.

2. The memory storage apparatus of claim 1, wherein the power management unit outputs an interrupt signal to the control logic when the sensed level of the external power supply is less than a reference voltage level.

3. The memory storage apparatus of claim 2, wherein the reference voltage level is less than a normal level of the external power supply and is greater than a minimum voltage level at which the non-volatile memory is operated.

4. The memory storage apparatus of claim 2, wherein the control logic outputs a control signal responsive to receiving the interrupt signal to control a read and/or write operation of the non-volatile memory.

5. The memory storage apparatus of claim 1, wherein the power-polling time control circuit maintains the voltage level sourced from the external power supply above the predetermined level and the voltage level controlled by the power-polling time control circuit is provided to the non-volatile memory during a time while a current read and/or write operation of the non-volatile memory are completed when a loss of the external power supply is predicted.

6. The memory storage apparatus of claim 1, wherein a level of the voltage level controlled by the power-polling time control circuit is provided to the non-volatile memory and ranges within an operation voltage range of the non-volatile memory during a time while a current read and/or write operation of the non-volatile memory are completed when a loss of the external power failure is predicted.

7. The memory storage apparatus of claim 2, wherein when the interrupt signal is generated, after the non-volatile memory enters into a read and/or write operation mode, the control logic completes a current read and/or write operation of the non-volatile memory.

8. The memory storage apparatus of claim 2, wherein when the interrupt signal is generated, the control logic does not input an initial operation command to the non-volatile memory.

9. The memory storage apparatus of claim 1, wherein the power management unit and the power-polling time control circuit comprise a single chip integrated circuit device.

10. The memory storage apparatus of claim 1, wherein the power management unit, the power-polling time control circuit, and the control logic comprise a single chip integrated circuit device.

11. The memory storage apparatus of claim 1, wherein the power management unit, the power-polling time control circuit, the control logic, and the non-volatile memory comprise a single chip integrated circuit device.

12. The memory storage apparatus of claim 1, wherein a restoration algorithm is not included in the memory storage apparatus.

13. The memory storage apparatus of claim 1, wherein a power input to the power management unit, the power-polling time control circuit, the control logic, and the non-volatile memory is supplied from an external apparatus coupled to the memory storage apparatus.

14. The memory storage apparatus of claim 1, further including a regulator coupled to the external power supply and wherein a power input to the control logic and the non-volatile memory is an output voltage generated by the regulator from the external power supply based on an input to the regulator comprising the voltage level sourced from the external power supply and controlled by the power-polling time control circuit.

15. The memory storage apparatus of claim 1, wherein a power input to the non-volatile memory from the external power supply passes through at least two regulators.

16. The memory storage apparatus of claim 1, wherein the memory storage apparatus comprises a multi-media card, a SD card (Secure Digital Card), a CF card (Compact Flash Card), a USB (Universal Serial Bus) flash disk and/or a memory stick.

17. A power off controller for a memory storage apparatus, comprising:
   a power management unit configured to sense a level of an input from an external power supply and generate a power loss prediction signal responsive to the sensed level, the input being provided as a power source to a memory of the memory storage apparatus;
   a power-polling time control circuit configured to control a rate at which the level of the input decreases after loss of the external power supply; and
   a control logic that controls a read and/or a write operation of the memory, the control logic being configured to control a current read and/or write operation of the memory responsive to the power loss prediction signal to allow completion of the current read and/or write operation before the level of the input decrease below a minimum level associated with operation of the memory.

18. A memory storage apparatus including the power off controller of claim 17 and further comprising the memory.

19. The memory storage apparatus of claim 18 wherein the memory storage apparatus comprises a multi-media card, a SD card (Secure Digital Card), a CF card (Compact Flash Card), a USB (Universal Serial Bus) flash disk and/or a memory stick.

20. A method for controlling operation of a memory storage apparatus after loss of an external power supply of the apparatus, the method comprising:

detecting a level of an input of the memory storage apparatus configured to couple to the external power supply;

generating a power loss prediction signal when the detected level falls below a predetermined level, the predetermined level being less than a normal level of the external power supply and greater than a minimum voltage level at which the memory storage apparatus is operated;

controlling a rate of decrease of a level of a power input to a non-volatile memory of the memory storage apparatus generated from external power supply after a loss of the external power supply; and controlling a current read and/or write operation of the non-volatile memory responsive to the power loss prediction signal so that the current read and/or write operation will not cause a data error in the non-volatile memory due to loss of the external power supply.

\* \* \* \* \*